United States Patent [19]

Iwakura et al.

[11] Patent Number: 5,362,874
[45] Date of Patent: Nov. 8, 1994

[54] LIGHT-SENSITIVE BISTRIHALOMETHYL-S-TRIAZINE COMPOUNDS

[75] Inventors: Ken Iwakura; Yuichi Wakata; Hirotaka Matsumoto; Mikio Totsuka, all of Shizuoka, Japan

[73] Assignee: Fuji Photo Film Co., Ltd., Kanagawa, Japan

[21] Appl. No.: 850,810

[22] Filed: Mar. 13, 1992

[30] Foreign Application Priority Data

Mar. 15, 1991 [JP] Japan .................................. 3-051454
Dec. 24, 1991 [JP] Japan .................................. 3-340891

[51] Int. Cl.$^5$ .................. C07D 251/20; C07D 401/12
[52] U.S. Cl. .................................................. 544/216
[58] Field of Search ........................................ 544/216

[56] References Cited

U.S. PATENT DOCUMENTS

| | | | |
|---|---|---|---|
| 3,954,475 | 5/1976 | Bonham et al. | 96/67 |
| 3,987,037 | 10/1976 | Bonham et al. | 260/240 |
| 5,055,579 | 10/1991 | Pawlowski et al. | 544/216 |

FOREIGN PATENT DOCUMENTS

| | | |
|---|---|---|
| 0332044 | 9/1989 | European Pat. Off. . |
| 0361682 | 4/1990 | European Pat. Off. . |
| 0461651 | 12/1991 | European Pat. Off. . |
| 3938978 | 5/1990 | Germany . |

OTHER PUBLICATIONS

Patent Abstracts of Japan, vol. 12, No. 442 (M-766)(3289) 21 Nov. 1988 for JP-A-63 173 682 (Fuji Photo Film Company) 18 Jul. 1988.

*Primary Examiner*—John M. Ford
*Attorney, Agent, or Firm*—Sughrue, Mion, Zinn, Macpeak & Seas

[57] ABSTRACT

A novel light-sensitive bistrihalomethyl-s-triazine compound is provided, which is represented by the general formula (I):

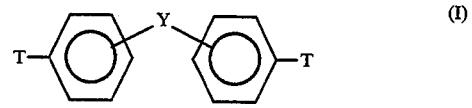

wherein T represents a (4,6-bistrihalomethyl-S-triazine-2-yl) group; Y represents a divalent group; and the benzene rings may further contain substituents; a novel photopolymerizable composition containing the same and a light- and heat-sensitive recording material containing the same.

5 Claims, No Drawings

LIGHT-SENSITIVE BISTRIHALOMETHYL-S-TRIAZINE COMPOUNDS

FIELD OF THE INVENTION

The present invention relates to a novel compound which produces a free radical when exposed to light, and a photopolymerizable composition containing the novel compound. More particularly, the present invention relates to a novel light-sensitive s-triazine compound and a photopolymerizable composition containing the novel compound.

The photopolymerizable composition of the present invention is useful for light- and heat-sensitive recording material for use in a color proof; light-sensitive transfer sheet for use in the preparation of multicolor images such as a color proof; photoresist for use in the preparation of a printing substrate; printing plate, etc.

BACKGROUND OF THE INVENTION

Compositions which undergo decomposition upon exposure to light to produce a free radical (free radical initiators) have been well-known in the field of light-sensitive recording materials. These compounds have been widely used as photopolymerization initiators which are contained in photopolymerizable compositions, light activators which are contained in free radical-containing photographic compositions, or initiators of acid catalyzation occurring upon exposure to light. Such free radical initiators are used to prepare various light-sensitive materials useful in printing materials, reproducing materials, copying materials and other recording materials.

As a halogen free radical initiator sensitive to wavelengths in the ultraviolet to visible light range, there has been proposed a halomethyl-S-triazine compound. Such a compound is further described in U.S. Pat. Nos. 3,954,475, 3,987,037, and 4,189,323, and JP-A-62-58241 (the term "JP-A" as used herein means an "unexamined published Japanese patent application").

Although such a compound is sensitive to wavelengths in the ultraviolet to visible light range, it has some difficulty remaining stable over time. Furthermore, such a compound becomes light yellow colored upon exposure. Therefore, it can hardly be used in color proofs which normally require strict color hue reproducibility.

SUMMARY OF THE INVENTION

It is therefore an object of the present invention to provide a free radical initiator sensitive to wavelengths in the ultraviolet to visible light range, which exhibits excellent storage stability and undergoes no coloring upon exposure.

Another object of the present invention is to produce a photopolymerizable composition containing such a free radical initiator; and a light- and heat-sensitive recording material comprising said photopolymerizable composition.

The above and other objects of the present invention will become more apparent from the following detailed description and examples.

The objects of the present invention are accomplished with a compound represented by the following general formula (I) containing two or more light-sensitive S-triazine skeletons in its molecule, a photopolymerizable composition containing such a free radical initiator, and a light- and heat-sensitive recording material comprising said photopolymerizable composition,

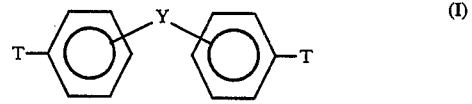

wherein T represents a (4,6-bistrihalomethyl-s-triazine-2-yl) group; Y represents a divalent group; and the benzene rings may further contain substituents.

DETAILED DESCRIPTION OF THE INVENTION

In formula (I), T represents a (4,6-bistrihalomethyl-s-triazine-2-yl) group, Y represents a divalent group; and the benzene rings may further contain substituents. Examples of such substituents in the benzene rings include an alkyl group, an alkoxy group or a halogen atom, preferably a $C_{1-6}$ alkyl group, a $C_{1-4}$ alkoxy group, a chlorine atom, a bromine atom or a fluorine atom.

Among the light-sensitive bistrihalomethyl-s-triazine compounds of the present invention represented by the general formula (I), those represented by the following general formulas (II) to (IV) are further preferred:

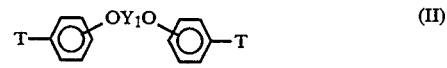

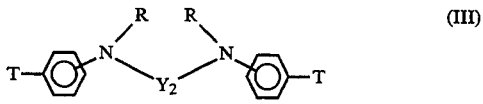

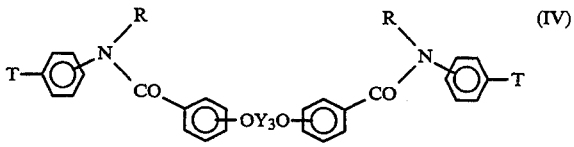

In formulas (II) to (IV), T represents a 4,6-bistrihalomethyl-s-triazine-2-yl group. The substituent $Y_1$ represents —$C_nH_{2n}$— (in which n represents an integer 2 to 20), —$C_mH_{2m}COO(CH_2)_nOCOC_mH_{2m}$— (in which m represents an integer 1 to 4, and n represents an integer 2 to 20), or —$CO(CH_2)_nCO$— (in which n represents an integer 0 to 20). The substituent $Y_2$ represents —$C_nH_{2n}$— (in which n represents an integer 2 to 20), —$CO(CH_2)_nCO$— (in which n represents an integer 0 to 20), or —$CO(C_6H_4)CO$—. The substituent $Y_3$ represents —$C_nH_{2n}$— (in which n represents an integer 2 to 20), —$CO(CH_2)_nCO$— (in which n represents an integer 0 to 20), or —$CO(C_6H_4)CO$—. The substituent R represents a hydrogen atom, a $C_{1-10}$ alkyl group or a $C_{2-10}$ acyl group. In formulas (II) to (IV), the benzene rings may further contain substituents. Examples of such substituents include a $C_{1-6}$ alkyl group, a $C_{1-4}$ alkoxy group, a chlorine atom, a bromine atom, and a fluorine atom.

Preferred among the (4,6-bistrihalomethyl-s-triazine-2-yl) groups represented by the substituent T are a (4,6-bistrichloromethyl-s-triazine-2-yl) group and a (4,6-bistribromomethyl-s-triazine-2-yl) group.

Specific examples of the light-sensitive bistrihalomethyl-s-triazine compound of the present invention include the following compounds:

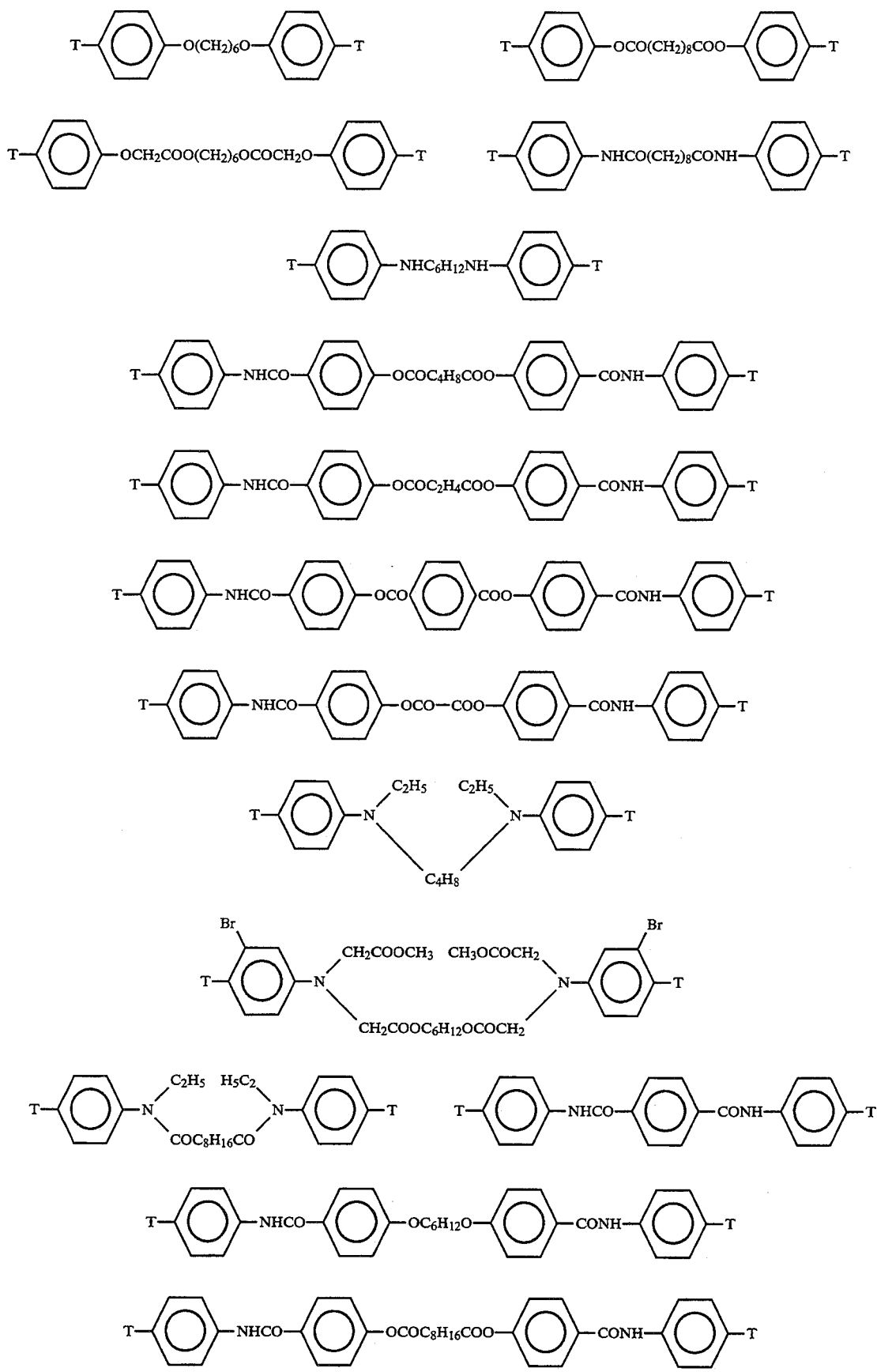

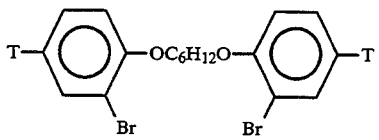

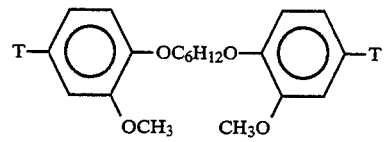

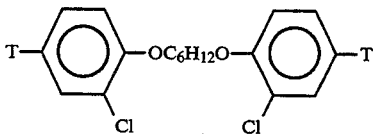

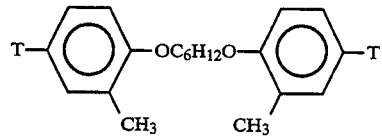

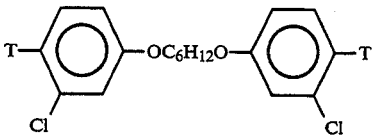

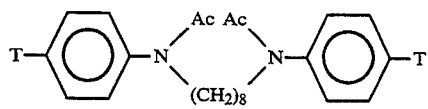

In these formulas, T represents a (4,6-bistrihalomethyl-S-triazine-2-yl) group.

The synthesis of the light-sensitive bistrihalomethyl-s-triazine compound of the present invention can be accomplished in accordance with either of the following equations 1 or 2:

Equation 1

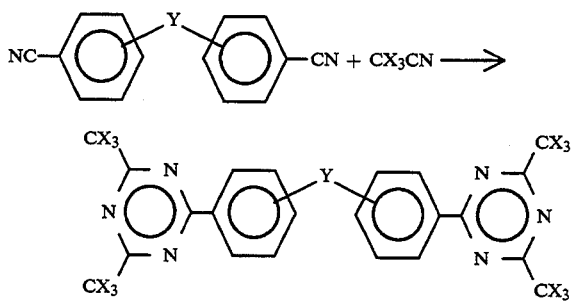

Equation 2

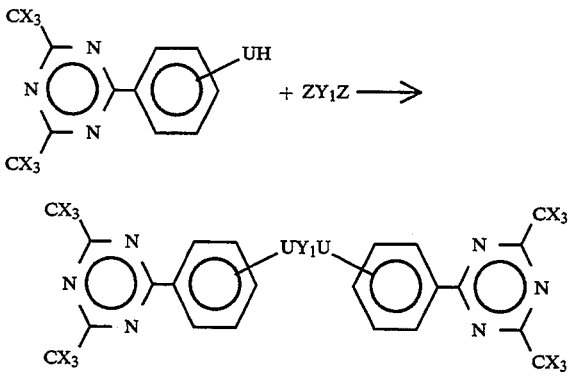

In these equations, X represents a halogen atom; Y and $Y_1$ each represents a divalent group; U represents —O—, —NR— or —NHCO($C_6H_4$)O—; and Z represents a halogen atom or a substituted sulfonyloxy group.

Equation 1 is for the reaction of bisbenzonitrile with trihaloacetonitrile. Equation 2 is for the dimerization of a phenol or aniline derivative containing a triazine skeleton with a bifunctional acid halide, active halide, active sulfonic ester, or the like. In either case, the synthesis is carried out in accordance with the conventional method.

As the ethylenically unsaturated compound to be contained in the photopolymerizable composition of the present invention, there may be preferably used a compound containing at least one terminal unsaturated group which is photopolymerizable by active light. Specific examples of such a compound include those disclosed in U.S. Pat. Nos. 2,760,863 and 3,030,023, and JP-B-35-5093, 35-14719, and 44-28727 (the term "JP-B" as used herein means an "examined Japanese patent publication").

Examples of such compounds include acrylic acid and its salts, acrylic esters, methacrylic acid and its salts, methacrylic esters, acrylamide, methacrylamide, maleic anhydride, maleic esters, itaconic acid, itaconic esters, styrenes, vinylethers, vinylesters, and arylesters. Preferred among these compounds are those containing two or more terminal unsaturated groups. Particularly preferred among these compounds are acrylic ester and methacrylic ester of polyvalent alcohol, acrylic amide and methacrylic amide of polyvalent amine, and acrylate or methacrylate-terminated epoxy resins. Specific examples of these compounds include ethylene glycol diacrylate, diethylene glycol diacrylate, triethylene glycol diacrylate, tetraethylene glycol diacrylate, ethylene glycol dimethacrylate, diethylene glycol dimethacrylate, triethylene glycol dimethacrylate, trimethylol propane triacrylate, pentaerythritol tetraacrylate, pentaerythritol tetramethacrylate, glycerin -triacrylate, 1,3-propanediol diacrylate, 1,2,4-butanetriol trimethacrylate, dipentaerythritol hydroxypentaacrylate, hexanediol-1,6-dimethacrylate, and 1,4-cyclohexanediol dimethacrylate. The molecular weight of the multifunctional monomer is preferably in the range of about 100 to about 5,000, more preferably in the range of about 300 to about 2,000.

A triazine derivative of the present invention is useful as a photopolymerization initiator for the above mentioned photopolymerizable composition. Although the present invention is not limited to such an application, the triazine derivative can be preferably used in the following recording materials comprising a photopolymerizable composition:

(1) A light- and heat-sensitive recording material which upon imagewise exposure to light forms in a photopolymerizable composition a latent image depending on which components taking part in the coloring or discoloration move therein upon heating to form color image, wherein at least one component which takes part in the coloration or discoloration is contained in microcapsules. Said photopolymerizable composition contains an ethylenically unsaturated compound and the above-mentioned bistrihalomethyl-S-triazine compound of the present invention.

In this system, it is preferred that at least one of the components taking part in coloration or discoloration is contained in microcapsules. Further, the photopolymerizable composition contains an ethylenically unsaturated compound and a photopolymerization initiator. Furthermore, it is preferred that the components taking part in coloration or discoloration comprise an electron donating colorless dye (color former) and an electron accepting compound (color developer).

If the photopolymerizable composition of the present invention is incorporated in to the light- and heat-sensitive recording material, there may be preferably used as the ethylenically unsaturated compound, an electron accepting compound containing one or more polymerizable ethylene groups. Specific examples of such a compound include methacryloxy ethyl esters of benzoic acid containing hydroxyl groups as disclosed in JP-A-63-173682 and acryloxy ethyl esters obtained by the similar synthesis method; esters of benzoic acid containing a hydroxyl group and hydroxymethyl styrene as disclosed in JP-A-59-83698, JP-A-60-141587, and JP-A-62-99190; hydroxystyrenes as disclosed in European Patent 29323; N-vinylimidazole complexes of zinc halide as disclosed in JP-A-62-167077 and JP-A-62-16708; developer monomers as disclosed in JP-A-63-317558; and compounds represented by the following general formula (V):

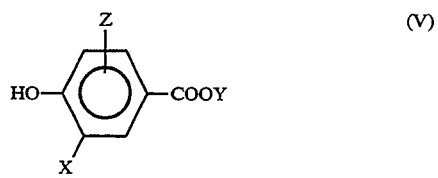

wherein X represents a hydrogen atom or halogen atom; Y represents a monovalent group containing a polymerizable ethylene group; and Z represents a hydrogen atom, an alkyl group, a hydroxyl group, an acyloxy group or an alkoxy group. Preferred among the monovalent groups represented by Y which contain polymerizable ethylene groups are aralkyl, acryloyloxyalkyl and methacryloyloxyalkyl groups containing a vinyl group.

The above mentioned light- and heat-sensitive recording material can be present in various configurations depending on the purpose.

One of the preferable configurations comprises a support having thereon a layer consisting of microcapsules containing an electron donating colorless dye, and a photocurable composition containing an electron accepting compound which further contains a polymerizable ethylene group and a photopolymerization initiator.

Another preferable configuration comprises a support having thereon a layer consisting of microcapsules containing an electron donating colorless dye, and a photopolymerizable composition containing an electron accepting compound, a compound containing a polymerizable ethylene group and a photopolymerization initiator.

A further preferable configuration comprises a support having thereon a layer consisting of microcapsules containing an electron donating colorless dye, a compound containing a polymerizable ethylene group and a photopolymerization initiator, and an electron accepting compound.

The above mentioned light-sensitive heat-sensitive recording material may be a monochromatic black-and-white (B/W) recording material or multicolor recording material.

The electron accepting compound to be incorporated in the above-mentioned light- and heat-sensitive recording material is preferably an electron accepting compound containing a polymerizable ethylene group as described above.

Examples of the electron accepting compound represented by formula (V) include vinylphenyl 3-chloro-4-hydroxybenzoate, vinylphenyl propyl 3-chloro- 4-hydroxybenzoate, (2-acryloyloxyethyl)-3-chloro-4-hydroxybenzoate, (2-methacryloyloxyethyl)-3-chloro-4-hydroxybenzoate, (6-methacryloyloxyhexyl)-3-chloro-4-hydroxybenzoate, (6-acryloyloxyhexyl)-3-chloro-4-hydroxybenzoate, (3-acryloyloxypropyl)-3-chloro-4-hydroxybenzoate, (3-methacryloyloxypropyl)-3-chloro-4-hydroxybenzoate, (4-acryloyloxybutyl)-3-chloro-4-hydroxybenzoate, (4-methacryloyloxybutyl)-3-chloro-4-hydroxybenzoate, (2-acryloyloxyethyl)-3-fluoro-4-hydroxybenzoate, vinylbenzyl 2,4-dihydroxy-6-methylbenzoate, vinylbenzyl 2,4-dihydroxy-5-methylbenzoate, vinylbenzyl 2,4-dihydroxy-3-methylbenzyl, vinylbenzyl 2,4-dihydroxy-3-chlorobenzoate, vinylbenzyl 2,4-dihydroxy-6-phenylbenzoate, vinylphenyl 2,4-dihydroxybenzoate, vinylphenyl propyl 2,4-dihydroxybenzoate, vinylbenzyl 2,4-dihydroxybenzoate, (2-acryloyloxyethyl)-2-acryloyloxy-4-hydroxybenzoate,(2-methacryloyloxyethyl)-2-methacryloyloxy-4-hydroxybenzoate, (2,3-bismethacryloyloxylpropyl)-2,4-dihydroxybenzoate, and (2,3-bisacryloyloxypropyl)-2,4-dihydroxybenzoate. However, the present invention is not limited to these compounds.

These electron accepting compounds may be used in combination with other nonpolymerizable electron accepting compounds. Examples of such nonpolymerizable electron accepting compounds include phenol derivatives, salicylic acid derivatives, metallic salts of aromatic carboxylic acid, acidic clay, bentonite, novolak resin, metal-treated novolak resin, and metal complexes. These examples are further described in JP-B-40-9309, JP-B-45-14039, JP-A-52-140483, JP-A-48-51510, JP-A-57-210886, JP-A-58-87089, JP-A-59-11286, JP-A-60-176795, and JP-A-61-95988.

If these nonpolymerizable electron accepting compounds are used as well, the amount of the polymerizable electron accepting compound to be used is preferably in the range of 50% by weight or more, more preferably 70% by weight or more.

Examples of the electron donating colorless dye to be incorporated in the above mentioned light-sensitive, heat-sensitive recording material include various compounds such as triphenylmethane phthalide compounds, fluorane compounds, phenothiazine compounds, indolyl phthalide compounds, leucoauramine compounds, rhodaminelactam compounds, triphenylmethane compounds, triazene compounds, spiropyran compounds and fluorene compounds.

Specific examples of phthalides are described in U.S. Reissue Pat. No. 23,024, and U.S. Pat. Nos. 3,491,111, 3,491,112, 3,491,116, and 3,509,174. Specific examples of fluoranes are described in U.S. Pat. Nos. 3,624,107, 3,627,787, 3,641,011, 3,462,828, 3,681,390, 3,920,510, and 3,959,571. Specific examples of spirodipranes are described in U.S. Pat. No. 3,971,808. Specific examples of pyridines and pyrazines are described in U.S. Pat. Nos. 3,775,424, 3,853,869, and 4,246,318. Specific examples of fluorene compounds are described in JP-A-63-94878.

In particular, if incorporated in full-color recording materials, the electron donating colorless dyes used which develop magenta color preferably may be compounds as disclosed in U.S. Pat. No. 4,800,149, West Patent Publication 2,265,233, West German Patent Application Disclosure (OLS) 2,409,112, JP-A-2-178087, and JP-A-2-117882. As electron donating colorless dyes which develop yellow color, there may be preferably used compounds as disclosed in U.S. Pat. Nos. 4,800,148, 4,775,656, 4,540,790, 4,025,090, 4,446,321, 4,365,503, 4,820,841, and 4,598,150, JP-A-62-288827, JP-A-62-288828, JP-A-63-251280, JP-A-63-251279, JP-A-63-251278, JP-A-64-25148, and British Patent 1,431,493. As electron donating colorless dyes which develop cyan color, there may be preferably used compounds as disclosed in JP-A-63-53542, JP-A-62-270662, JP-A-63-113446, JP-A-63-112188, JP-A-1-213636, and European Patent Application Disclosure 82822A.

The proportion of the electron accepting compound and the electron donating colorless dye to be incorporated into the above mentioned light- and heat-sensitive recording material is preferably in the range of 1 to 100 (color developer/color former, molar ratio).

The amount of the electron donating colorless dye to be used per color layer is in the range of 0.1 to 2 g/m$^2$, preferably 0.2 to 1 g/m$^2$. The amount of the electron accepting compound to be used per color layer is in the range of 0.2 to 20 g/m$^2$, preferably 0.4 to 10 g/m$^2$.

The microcapsulization of the electron donating colorless dye to be used in the above-mentioned light- and heat-sensitive recording material can be accomplished by any suitable method known in the art. Examples of such methods include a method utilizing coacervation of a hydrophilic wall-forming material as disclosed in U.S. Pat. Nos. 2,800,457 and 2,800,458; an interfacial polymerization process as disclosed in U.S. Pat. No. 3,287,154, British Patent 990,443, JP-B-38-19574, JP-B-42-446, and JP-B-42-771; a method utilizing deposition of a polymer as disclosed in U.S. Pat. Nos. 3,418,250 and 3,660,304; a method using isocyanate polyol wall material as disclosed in U.S. Pat. No. 3,796,669; a method using an isocyanate wall material as disclosed in U.S. Pat. No. 3,914,511; a method using urea-formaldehyde or a urea formaldehyde-resorcinol wall-forming material as disclosed in U.S. Pat. Nos. 4,001,140, 4,087,376 and 4,089,802; a method using melamin-formaldehyde resin, hydroxppropyl cellulose or another wall-forming material as disclosed in U.S. Pat. No. 4,025,455; an in situ method utilizing polymerization of monomers as disclosed in JP-B-36-9168, and JP-A-51-9079; an electrolysis dispersion cooling method as disclosed in British Patent 952,807 and 965,074; and a spray drying method as disclosed in U.S. Pat. No. 3,111,407, and British Patent 930,422. The present invention is not limited to these methods. It is preferred that a high polymer film is formed as the microcapsule wall after emulsification of the core substance.

The preparation of the microcapsule wall can be effectively accomplished by a microcapsulization method utilizing the polymerization of reactants from the interior of oil drops. In accordance with this microcapsulization method, capsules with a uniform grain diameter and an excellent preservability suitable for use in recording materials can be obtained within a short period of time.

For example, if polyurethane is used as the capsule wall-forming material, a polyvalent isocyanate and optionally a second substance which reacts with the polyvalent isocyanate to form a capsule wall (e.g., polyol, polyamine), are mixed into an oily liquid to be capsulized. The resulting capsulized substances are emulsion-dispersed in water, and then heated to cause a high polymer compound formation reaction at the oil drop interface, thereby forming a microcapsule wall. A low boiling auxiliary solvent with a strong dissolving power may be contained in the oily liquid.

Examples of the polyvalent isocyanate to be used in this reaction, and the polyol and polyamine which react with the polyvalent isocyanate, are all disclosed in U.S. Pat. Nos. 3,281,383, 3,773,695 and 3,793,268, JP-B-48-40347, JP-B-49-24159, JP-A-48-80191, and JP-A-48-84086. The polyol and polyamide compounds can be used as well.

In the preparation of microcapsules, a water-soluble, high polymer compound can be used. Such a water-soluble, high polymer compound may be a water-soluble anionic, nonionic or amphoteric high polymer compound.

As such an anionic high polymer compound, there may be used a natural or synthetic compound, e.g., an anionic high polymer compound containing —COO—, —SO$_2$—, etc. Specific examples of natural anionic high polisher compounds include gem arabic, alginic acid, and pectin. Specific examples of semi-synthetic anionic high polymer compounds include carboxymethyl cellulose, phthalated gelatin, sulfated starch, sulfated cellulose, and lignin sulfonic acid.

Specific examples of synthetic anionic high polymer compounds include maleic anhydride (including the hydrolyzate thereof) copolymers, acrylic (including methacrylic) polymers and copolymers, vinylbenzene-sulfonic polymers and copolymers, and carboxy-modified polyvinyl alcohols.

Specific examples of nonionic high polymer compounds include polyvinyl alcohol, hydroxyethyl cellulose, and methyl cellulose.

A specific example of an amphoteric compound includes gelatin.

Such a water-soluble high polymer compound is used in the form of a 0.01 to 10 wt. % aqueous solution.

The size of the capsules to be incorporated in the above-mentioned light- and heat-sensitive recording material is in the range of 80 $\mu$m or less, particularly preferably in the range of 20 $\mu$m or less for better preservation and handling. If the size of the capsules is too small, the surface area per unit solid content increases, requiring a large amount of a wall-forming material. Accordingly, the lower range for the size of the capsules is preferably 0.1 $\mu$m.

The electron donating colorless dye to be incorporated in the above-mentioned light- and heat-sensitive recording material may be present in the microcapsules in the form of a solution or a solid. If a solvent is used as well, the amount of the solvent to be incorporated into the capsules is preferably in the range of 1 to 500 parts by weight based on 100 parts by weight of electron donating colorless dye. As the solvent, there may be used a natural or synthetic oil. Examples of the solvent include cotton seed oil; kerosene; paraffin; naphthenic oil; alkylated biphenyl; alkylated terphenyl; chlorinated paraffin; alkylated naphthalene; a diarylethane such as 1-phenyl-1-xylylethane, 1-phenyl-1-p-ethylphenylethane and 1,1′-ditollylethane; phthalic ester; phosphoric ester; citric ester; benzoic ester; alkylamide; aliphatic ester; trimesic ester; secondary butyl alcohol; methyl isobutyl ketone; β-ethoxy ethyl acetate; methyl cellosolve; and cyclohexanone.

In microcapsulization, as an auxiliary solvent for dissolving the electron donating colorless dye therein, there may be used a volatile solvent. Examples of such a solvent include ethyl acetate, butyl acetate, and methylene chloride.

If the above-mentioned light- and heat-sensitive recording material is used as a multicolor image-recording material, the material preferably comprises a plurality of layers containing microcapsules containing electron donating colorless dyes which develop different color hues and photopolymerizable compositions sensitive to light in different wavelength ranges. The material for the preferably comprises an interlayer containing an ultraviolet absorbent interposed between the light- and heat-sensitive layers.

The interlayer mainly comprises a binder and an ultraviolet absorbent, and optionally a hardener or an additive such as polymer latex.

As such an ultraviolet absorbent there may be used a compound known in the art, such as a benzotriazole compound, a cinnamate compound, a ω-aminobutadiene compound and a benzophenone compound. The most preferred examples of such an ultraviolet absorbent include ultraviolet absorbents having a structure such that it can hardly be diffused into adjacent layers. An example of this is a polymer and latex copolymerized with an ultraviolet absorbent. For such an ultraviolet absorbent, reference can be made to European Patent 127,819, JP-A-59-68731, JP-A-59-26733, JP-A-59-23344, JP-A-58-111942, JP-A-47-560, British Patent 2,118,315, and U.S. Pat. Nos. 4,307,184, 4,202,836, 4,202,834, 4,207,253, and 4,178,303.

These ultraviolet absorbents may be incorporated in an interlayer, but may optionally be incorporated in a protective layer, a light- and heat-sensitive layer, an antihalation layer or the like, if desired.

The dispersion of the photopolymerizable composition, and the dispersion and capsulization of the electron donating colorless dye may preferably be effected in a water-soluble polymer. As such a water-soluble polymer, there may be used a compound which can be dissolved in water in an amount of 5% by weight or more at a temperature of 25° C. Specific examples of such a compound include a protein such as gelatin, a gelatin derivative, albumin and casein, a cellulose derivative such as methyl cellulose and carboxymethyl cellulose, a saccharide derivative such as sodium alginate and starch (including modified starch), gum arabic, a hydrolyzate of polyvinyl alcohol, a styrene-maleic anhydride copolymer, a carboxy-modified polyvinyl alcohol, polyacrylamide, a saponification product of a vinyl acetate-polyacrylic acid copolymer, and a synthetic high polisher compound such as polystyrenesulfonate.

Preferred among these water-soluble polymers are gelatin and polyvinyl alcohol.

Examples of the binder optionally used in the above-mentioned light- and heat-sensitive recording material include the above mentioned water-soluble high polymer compounds, and solvent-soluble high polymer compounds such as polystyrene; polyvinyl formal; polyvinyl butyral; an acrylic resin such as polymethyl acrylate, polybutyl acrylate, polymethyl methacrylate, polybutyl methacrylate and copolymers thereof; phenolic resin; styrene-butadiene resin; ethyl cellulose; epoxy resin; urethane resin; and high polymer latexes thereof. Preferred among these compounds are gelatin and polyvinyl alcohol.

The coating solution of the above-mentioned light- and heat-sensitive recording material comprises the above-mentioned microcapsule dispersion, the electron accepting compound dispersion, the photopolymerization initiator, and various additives. This coating solution is coated on a desired support, and then dried. If the material is used for a multicolor recording material, an interlayer and a light- and heat-sensitive layer may be successively or simultaneously coated on the material. A protective layer may be preferably provided as an uppermost layer.

As an image recording method, there can be used various exposure methods, such as contact exposure through an original such as lithographic film, enlarged exposure to slide, liquid crystal image, etc., and reflected exposure to light reflected by an original. If multicolor recording is effected, light of different wavelengths may be used to effect image recording at multiple times. The light of different wavelengths can be obtained by altering the light source or light filter, or by imagewise printing through a thermal head.

The light- and heat-sensitive recording material which has been imagewise exposed to light, is then subjected to heat development. As the heating method for the heat development, there can be used any method which has heretofore been known in the art. The heating temperature is normally in the range of 80° C. to 200° C., preferably 100° C. to 160° C. The heating time is in the range of 1 second to 5 minutes, preferably 3 seconds to 1 minute. The heat development may be followed by entire exposure so that unhardened portions can be photo-cured.

(2) A light-sensitive transfer sheet comprising a tentative support having provided thereon a peelable layer made of an organic polymer,, and a photopolymerizable composition layer containing as a photopolymerization initiator, a light-sensitive bis-trihalomethyl-s-triazine compound of the present invention in this order.

Such a light-sensitive transfer sheet can be effectively used for the preparation of a multicolor image such as color proof by surprint process.

An excellent process for the preparation of a color proof by surprint process is disclosed in JP-B-3-71707 (corresponding to JP-A-59-97140).

This process comprises forming an image made of a photopolymerizable composition layer on a tentative support, transferring the respective color image onto a sheet having a photopolymerizable image-receiving layer provided thereon (light-sensitive transfer sheet) before transferring the respective color image onto a permanent support, bringing the material into close contact with the permanent support, and then entirely exposing the material to light to harden the photopolymerizable image-receiving layer.

This process has many advantages. For example, an image can be obtained in the same direction with respect to a masking original. Furthermore, due to an ethylenic multifunctional monomer being incorporated into the material, the photopolymerizable image-receiving layer is inherently soft so as to enable transfer of color images at a low temperatures, but is then hardened upon exposure, thereby providing excellent resistance to adhesion and flaw.

The photopolymerization initiator to be incorporated into the above-mentioned photopolymerizable composition layer must be substantially nonsusceptible to coloring at all steps. The light-sensitive bistrihalomethyl-s-triazine compound of the present invention exhibits excellent properties compared with former photopolymerization initiators.

Such a light-sensitive transfer sheet comprises a tentative support having provided thereon a peelable layer and a photopolymerizable composition layer in this order. Such a light-sensitive transfer sheet can be prepared by, for example, the following process:

As the tentative support, there may be used a chemically and thermally stable flexible substance. Such a substance may optionally be permeable to chemical rays. Specific examples of such a substance which can be used in the present invention include various substances as disclosed in JP-A-47-41830, JP-A-48-9337, and JP-A-51-5101, e.g., cellulose acetate, polyvinyl chloride, polystyrene and polypropylene. In particular, polyethylene terephthalate, polycarbonate, and products of heat treatment thereof are preferred.

A peelable layer comprising an organic polymer is provided on the tentative support. A material known as peelable layer material can be, used as the material for the peelable layer. Examples of the peelable layer material include an alcohol-soluble polyamide, a hydroxystyrene polymer, vinyl polyacetate, poly(meth)acrylate, polyvinyl chloride, polyvinyl butyrate, a methyl methacrylateacrylate copolymer, a polyethylene-(meth)acrylic acid copolymer, a metal-crosslinked polyethylene-(meth)acrylic acid copolymer, cellulose acetate butyrate, a vinyl chloride-vinyl acetate copolymner, cellulose diacetate, cellulose triacetate, polyvinyl alcohol, a styrene-maleic anhydride copolymer, and a blend of resins obtained by partial esterification thereof with methoxymethylated nylon. A mixture of an alcohol-soluble polyamide with a hydroxystyrene polymer is preferred. The proportion of the alcohol-soluble polyamide to hydroxystyrene polymer is preferably in the range of 4:6 to 9:1 (mixing ratio by weight) considering peelability of the peelable layer from the support under high humidity and further considering adhesiveness to the support on the image-receiving side upon transfer.

The peelable layer can be formed by dissolving the above-mentioned materials in the proper solvent to prepare a coating solution, coating the coating solution on a tentative support, and then drying the material. Various surface active agents may be incorporated into the coating solution as surface condition improvers. In particular, fluorine surface active agents are effective. The thickness of the peelable layer is normally in the range of 0.1 to 20 $\mu$m, preferably 0.2 to 5 $\mu$m, particularly preferably 0.3 to 3 $\mu$m.

On the opposite surface of the tentative support, a backing layer made of a high polymer substance such as polyvinyl butyral, vinyl chloride-vinyl acetate copolymer and cellulose acetate may be provided for the purpose of improving workability. The backing layer may contain various additives such as a matting agent.

On the peelable layer, a photopolymerizable composition layer is provided.

In order to form such a photopolymerizable composition layer, various materials used in known light-sensitive transfer sheets can be used. This layer preferably comprises a water-developable or alkali-developable photopolymerizable composition.

The photopolymerizable composition layer comprises a multifunctional vinyl monomer which exhibits a boiling point of 150° C. or higher under nominal pressure and can undergo additional polymerization to form a photopolymer or a monomer compound such as a vinylidene compound, an organic polymer binder, a photopolymerization initiator which is activated by active light, and optionally, a thermal polymerization inhibitor.

As the vinyl monomer or vinylidene compounds used in the formation of the photopolymerizable composition layer, unsaturated esters of polyol, and particularly esters of acrylic acid or methacrylic acid can be used. Specific examples of such esters include ethylene glycol diacrylate, glycerin triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanedioldiacrylate, 1,5-pentanedioldimethacrylate, bisacrylate and bismethacrylate of polyethylene glycol having a molecular weight of 200 to 400, and analogous compounds thereof.

As monomer compounds, unsaturated amides may be used as well. Examples of such unsaturated amides include unsaturated amides of acrylic acid and methacrylic acid, both of which contain $\alpha,\omega$-diamine. Ethylene bismethacrylamide can also be used as the unsaturated amide. The alkylene chain in the unsaturated amides may be opened by carbon atoms. However, the photopolymerizable monomer to be used in the present invention is not limited to these compounds.

Examples of the organic polymer binder include addition poisoners containing carboxylic acid in side chains such as methacrylic acid copolymers (e.g., copolymers of methyl methacrylate and methacrylic acid, copolymers of ethyl methacrylate and methacrylic acid, butyl methacrylate and methacrylic acid, copolymers of allyl methacrylate and methacrylic acid, copolymers of ethyl acrylate and methacrylic acid, copolymers of ethyl methacrylate, styrene and methacrylic acid, copolymers of benzyl methacrylate and methacrylic acid), acrylic acid copoloymers (e.g., copolymer of ethyl acrylate and acrylic acid, copolymers of butyl acrylate and acrylic acid, copolymers of ethyl acrylate, styrene and acrylic acid), itaconic acid copolymers, crotonic acid copoolymers, partially esterified maleic acid copolymers, and acidic cellulose derivatives containing carboxylic acid in side chains. However, the organic polisher binder of the present invention is not limited to these compounds. These organic polisher binders may be singly used. Two or more of these organic polymer binders may be used in a proper mixing proportion as long as they are compatible enough so as not to cause demixing through all the preparation steps, including preparation, coating and drying of the coating solution.

The molecular weight of these organic polymer binders can vary widely depending on the kind of polymer used and is normally in the range of 5,000 to 2,000,000, preferably 10,000 to 1,000,000.

The optimum mixing proportion of the monomer compound to organic polymer binder depends on the combination of monomer compound and organic polymer binder used and is preferably in the range of 1:10 to 2:1 (by weight).

In order to form a colored image, a coloring agent such as a dye and a pigment may be incorporated into the photopolymerizable composition layer. Also, the layer containing a Coloring agent and the layer containing a substantially colorless photopolymerizable composition layer may be laminated.

Processes for the preparation of a color proof from these materials are further disclosed in JP-B-3-71707 (corresponding to JP-A-59-97140), JP-A-61-188537, and JP-A-63-298337.

In the photopolymerizable composition containing the triazine derivative of the present invention, other compounds capable of initiating photopolymerization of a compound having an ethylenically unsaturated bond may be used as well. Examples of these compounds include organic sulfur compounds as described in J. Corset, *Light-sensitive Systems*, Chap. 5, peroxides, redox compounds, azo compounds, diazo compounds, substituted benzophenone derivatives, aromatic ketones, rofin dimers, and organic halides other than the bistrihalomethyl-s-triazine compound of the present invention. If the recording material is used for the purpose of color proof or the like, the proper amount of a substantially colorless compound should be used.

The content of the photopolymerization initiator in the photopolymerizable composition is preferably in the range of 0.01 to 20% by weight, more preferably 0.2 to 15% by weight, most preferably 0.5 to 10% by weight, based on the total weight of the ethylenically unsaturated compounds in the photopolymerizable composition containing the light-sensitive S-triazine compound according to the present invention. If this content falls below 0.01% by weight, insufficient sensitivity is observed. On the contrary, if the content exceeds 10% by weight, the sensitivity does not increase. Among all the photopolymerization initiators used, the triazine compound of the present invention is preferably used in an amount of 40% by weight or more, more preferably 50% by weight or more.

Besides the ethylenically unsaturated compound and triazine derivative, the photopolymerizable composition of the present invention may comprise a spectral sensitizing dye for adjusting the wavelength of the light to which it is sensitive. Various compounds known in the art may be used for the spectral sensitizing dyes. These spectral sensitizing dyes are listed in the above cited patents relating to photopolymerization initiators, Research Disclosure Vol. 200, Item 20035, December 1980, and Katsumi Tokumaru and Shin Okawara, *Sensitizers*, published by Kodansha, pp. 160–163 (1987).

The photopolymerizable composition of the present invention may also comprise a reducing agent such as an oxygen scavenger, an active hydrogen donor chain transfer agent, and another compound as the auxiliary agent for accelerating polymerization via a chain transfer reaction. Phosphine, phosphonate, phosphite, stannous salt or other compounds which can be easily oxidized by oxygen can be used as the oxygen scavenger. Examples of such an oxygen scavenger include N-phenyl glycine, trimethyl barbituric acid, N,N-dimethyl-2,6-diisopropylaniline, and N,N,N-2,4,6-pentamethylaniline. Further, thiols, thioketones, trihalomethyl compounds, lophine dimer compounds, iodonium salts, sulfonium salts, azinium salts, and organic peroxides as described later are useful as polymerization accelerators.

Along with these compounds, a polyvinyl cinnamate, polyvinyl cinnamylidene acetate, a light-sensitive resin containing α-phenylmaleimide group or the like can be incorporated as a photocrosslinkable composition. Also, a thermal polymerization inhibitor may optionally be incorporated. The thermal polymerization inhibitor is used to inhibit the thermal polymerization of the photopolymerizable composition or the polymerization thereof with time, thereby improving the chemical stability of the photopolymerizable composition during its preparation or storage.

The photopolymerizable composition of the present invention may optionally comprise a binder. A wide range of synthetic, semi-synthetic or natural high polymer compounds may be used as such binders, depending on the purpose. Specific examples of these binders include proteins such as gelatins, gelatin derivatives, albumine and casein; cellulose derivatives such as methyl cellulose and carboxymethyl cellulose; saccharide derivatives such as sodium alginate and starch (including modified starch); gum arabic; synthetic high polymer compounds such as polyvinyl alcohol, hydrolyzate of styrene-maleic anhydride copolymer, carboxy-modified polyvinyl alcohol, polyacrylamide, saponification product of vinyl acetate-polyacrylic acid copolymer, polystyrene sulfonate, chlorinated polyolefin, polyacrylic acid, polymethacrylic acid, ester polyacrylate, ester polymethacrylate, vinyl chloride-acrylonitrile copolymer and vinylidene chloride-acrylonitrile copolymer; and binders as disclosed in JP-A-60-258539, JP-A-52-99810, JP-B-54-34327, JP-B-55-38961, JP-B-54-25957, JP-B-58-12577, and JP-B-55-6210.

If the photopolymerizable composition layer comprising a binder is developed with an alkaline aqueous solution, a binder which is insoluble in water but soluble (or at least swells) in an alkaline aqueous solution may be preferably used. If the recording material of the present invention is used as a light- and heat-sensitive recording material, there may be preferably used gelatin; polyvinyl alcohol; solvent-soluble high polymer compounds such as polystyrene, polyvinyl formal, polyvinyl butyral, an arylic resin (e.g., polymethyl acrylate, polybutyl acrylate, polymethyl methacrylate, polybutyl methacrylate, or a copolymer thereof), a phenol resin, a styrene-butadiene resin, ethyl cellulose, an epoxy resin, and an urethane resin; or a high polymer latex thereof. Preferred among these binders are gelatin and polyvinyl alcohol.

The photopolymerizable composition of the present invention may comprise various surface active agents for the purpose of aiding coating and emulsion dispersion, inhibiting charging and adhesion, and improving smoothness.

Nonionic surface active agents such as saponin and polyethylene oxide derivative (e.g., polyethylene oxide, alkyl ether of polyethylene oxide), anionic surface active agents such as alkylsulfonate, alkylbenzenesulfonate, alkylnaphthalenesulfonate, alkylsulfuric ester, N-acyl-N-alkyltaurine, sulfosuccinic ester and sulfoalkyl polyoxyethylene alkyl phenyl ether, amphoteric surface active agents such as alkylbetaine and alkylsulfobetaine, and cationic surface active agents such as aliphatic and aromatic quaternary ammonium salts may be optionally used as the surface active agents.

In order to control the physical properties of the film, the photopolymerizable composition of the present invention can comprise a plasticizer. Examples of such a plasticizer include phthalic esters such as diethyl phthalate, dibutyl phthalate and dioctyl phthalate; glycol esters such as triethylene glycol dicapric ester; phosphoric esters such as tricresyl phosphate; aliphatic dibasic esters such as dioctyl adipate and dibutyl sebacate; and amides such as benzenesulfonamide and toluenesulfonamide.

In order to improve adhesivity, the photopolymerizable composition of the present invention may comprise an adhesion accelerator. Examples of such an adhesion accelerator include compounds disclosed in JP-B-50-9177, JP-B-54-5292, JP-B-55-22481, JP-B-57-49894, and U.S. Pat. No. 4,629,679.

The light- and heat-sensitive recording material as described in the group (1) may further comprise various additives in addition to the above-mentioned additives as is necessary. Typical examples of dyes for inhibiting irradiation or halation include leuco dyes, ultraviolet absorbents, fluorescent brightening agents matting agents, coating aids, curing agents, antistatic agents, and smoothness improvers as described in Research Disclosure, Vol. 176, Item 17643, December 1978, and Vol. 187, Item 18716, November 1979.

The photopolymerizable composition of the present invention used to prepare an image-forming material may be properly coated on a support in the form of a solution or a dispersion in a solvent, or in the form of a dispersion in water. A protective layer or film may be provided as an uppermost layer.

A natural or synthetic oil may be used as the solvent for preparation of the coating solution. Examples of such a solvent include cotton seed oil, kerosene, paraffin, naphthenic oil, alkylated biphenyl, alkylated terphenyl, chlorinated paraffin, alkylated naphthalene, diaryl ethane (such as 1-phenyl-1-xylylethane, 1-phenyl-1-p-ethylphenylethane and 1,1'-ditollylethane), ester phthalate, ester phosphate, ester citrate, ester benzoate, alkylamide, aliphatic esters, trimesic esters, secondary butyl alcohol, methyl isobutyl ketone, β-ethoxy ethyl acetate, methyl cellosolve acetate, cyclohexanone, methanol, ethanol, propanol, acetone, methyl ethyl ketone, toluene, xylene, methyl chloroform, methylene chloride, ethylene glycol monoethyl ether, 1-methoxy-2-propanol, dimethylformamide, and dimethyl sulfoxide.

The coating of the coating solution on a support can be accomplished by means of a blade coater, rod coater, knife coater, roll doctor coater, comma coater, reverse roll coater, transfer roll coater, gravure coater, kiss-roll coater, curtain coater, extrusion coater, or the like. Details of the coating method can be found in Research Disclosure, Vol. 200, Item 20036, December 1980. The thickness of the recording layer is preferably in the range of 1.0 to 100 μm.

Examples of the support material include paper; coated paper; laminated paper; synthetic paper; transparent film such as polyethylene terephthalate film, cellulose triacetate film, polyethylene film, polystyrene film and polycarbonate film; plate of metal such as aluminum, zinc and copper; and support materials obtained by subjecting these support materials to various treatments such as surface treatment, undercoating and vacuum metallizing.

Details of these support materials can be found in Research Disclosure, Vol. 200, Item 20036, December 980. These supports may optionally comprise an antihalation layer provided on one surface thereof, and a sliding layer, antistatic layer, anticurling layer, adhesive layer or the like provided on the other surface, depending on the purpose.

If the photopolymerizable composition of the present invention is used as a resist for use in printed wiring, a support material obtained by providing a thin layer of metal, such as copper, on a plastic plate or plastic film by vacuum deposition or plating can be used. If the recording material of the present invention is used as a printing plate, a plastic film provided with an aluminum plate or layer is used as the support. Furthermore, if the recording material of the present invention is used as a light- and heat-sensitive recording material, paper, coated paper, laminated paper, synthetic paper, or transparent film such as polyethylene terephthalate film, cellulose triacetate film, polyethylene film, polystyrene film and polycarbonate film is used as the support.

The photopolymerizable composition of the present invention undergoes a polymerization reaction was exposed to light in the ultraviolet to visible range at a high sensitivity and thus can be used for various image-recording materials.

As a light source, a mercury vapor lamp, xenon lamp, tungsten lamp, metal halide lamp, argon laser, helium neon laser, semiconductor laser, LED (light emitting diode) and a fluorescent tube can be used.

Contact exposure through an original such as lithographic film, enlarged exposure to slide, liquid crystal image, etc. and reflected exposure to light reflected by an original can be used as the exposure method for use in image recording. The recording material which has been imagewise exposed to light, is eluted on the unexposed portion with a proper developer such as an organic solvent, alkaline aqueous solution or alkaline aqueous solution containing an organic solvent. In this manner, a photo-set image on the substrate is obtained. However, if a light- and heat-sensitive recording material is used, the recording material is directly subjected to heat development to obtain an image.

The photopolymerizable composition of the present invention can be widely used as a resist for a printed-wiring board, lithographic or letterpress printing plate, relief engraving material, or a light- and heat-sensitive recording material, etc.

The present invention will be further described in the following examples. However, the present invention should not be construed as being limited thereto.

EXAMPLE 1

Synthesis of Compound-1:

0.01 mol of 1,5-bis(p-cyanophenoxy)pentane, 0.1 mol of trichloroacetonitrile, 10 ml of methylene chloride, and 1.0 g of aluminum tribromide were weighed in a three-necked flask with a hydrogen chloride gas intake pipe attached. Hydrogen chloride gas was then introduced into the flask under cooling with ice with stirring for 1 hour. The gas was turned off and the mixture was stirred under cooling with ice for 6 hours. The mixture was then allowed to stand at room temperature for 5 days. The resulting reaction mixture was then poured into ice water and then extracted with ethyl acetate. This ethyl acetate phase was concentrated under reduced pressure. The resulting reaction product was then recrystallized from a mixture of ethyl acetate and ethanol to obtain Compound-1 of the following general formula (m.p. 179°–181° C.):

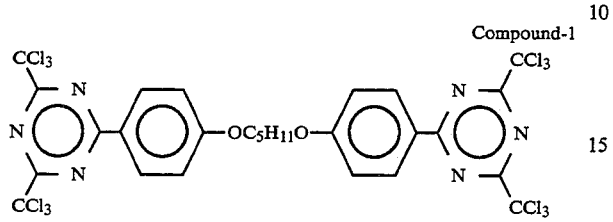

Compound-1

EXAMPLE 2

Synthesis of Compound-2:

0.01 mol of 2-[4-(4-hydroxybenzoylamino)phenyl]-4,6-bistrihalomethyl-s-triazine, 0.005 mol of chloride sebacate, 0.01 mol of pyridine, and 20 ml of tetrahydrofurane were weighed in a round flask. The mixture reacted by stirring at room temperature for 10 hours. The resulting reaction mixture was poured into ice water. A crystal mixture was obtained by filtration, and then recrystallized using a mixture of ethyl acetate and methanol, thereby obtaining Compound-2 of the following general formula (m.p. 145°–145° C.):

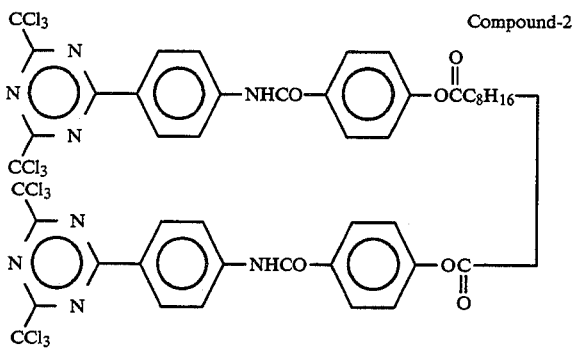

Compound-2

EXAMPLE 3

Synthesis of Compound-3:

0,005 mol of 2-(4-aminophenyl)-4,6-bistrihalomethyl-s-triazine, 0.0025 mol of chloride sebacate, 0,005 mol of pyridine, and 10 ml of tetrahydrofurane were weighed in a round flask. The mixture reacted by stirring at room temperature for 6 hours. The resulting reaction mixture was poured into ice water. A crystal mixture was obtained by filtration, and then recrystallized using a mixture of ethyl acetate and methanol, thereby obtaining Compound-3 of the following general formula (m.p. 99°–107° C.):

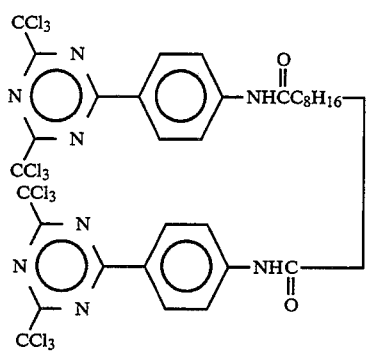

Compound-3

EXAMPLE 4

Synthesis of Compound-4:

A reaction was effected in the same manner as in Example 1, except that 0.01 mol of 1,6-bis(p-cyanophenoxymethylcarbonyloxy)hexane was used instead of 0.01 mol of 1,5-bis(p-cyanophenoxy)pentane. Thus, Compound-4 of the following general formula was obtained (m.p. 135°–137° C.):

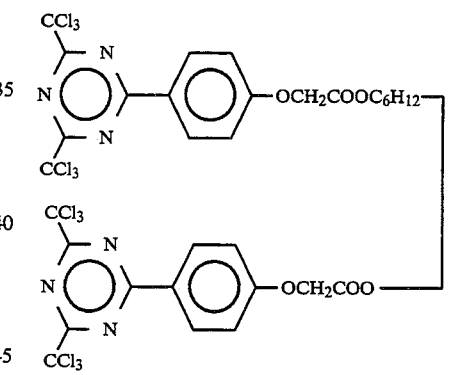

Compound-4

EXAMPLE 5 TO 7

Compound-5 to Compound-7 were obtained in the same manner as in Example 2.

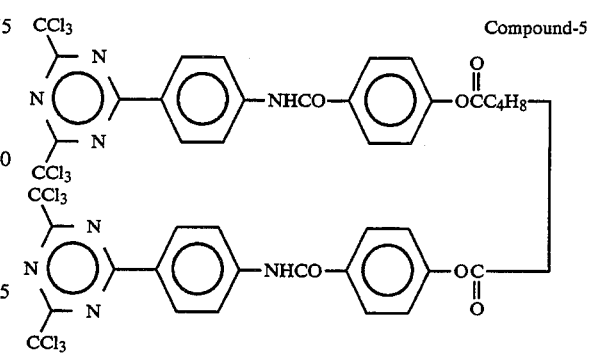

Compound-5

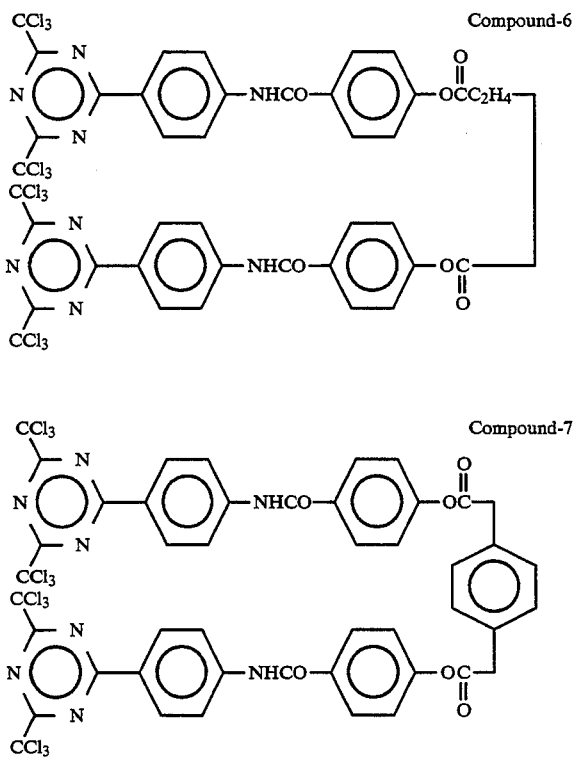

Compound-5 exhibited a melting point of 250° to 255° C. Compound-6 exhibited a melting point of 294° to 297° C. Compound-7 decomposed at a melting point of 300° C. or higher.

EXAMPLES 8 TO 10

1-1. [Preparation of electron donating colorless dye capsule solution (A)]

8.9 g of 3-(1-ethyl-2-methylindol-3-yl)-3-(2-methyl-4-diethylaminophenyl)-4-azaphthalide was dissolved in 16.9 g of ethyl acetate. 20 g of Takenate D-110N (produced by Takeda Chemical Industries, Ltd.) and 2 g of Millionate MR200 (produced by Nihon Polyurethane Kogyo K.K.) were added to the solution. This solution was added to a mixture of 42 g of 8% phthalated gelatin and 1.4 g of a 10% solution of sodium dodecylbenzenesulfonate, and then subjected to emulsion dispersion at a temperature of 20° C. to obtain an emulsion. 14 g of water and 72 g of a 2.9% aqueous solution of triethylenepentamine were added to the emulsion thus obtained. The resulting mixture was heated to a temperature of 60° C. while stirring for 2 hours, thereby obtaining a solution containing capsules having an average grain diameter of 0.5 μm.

1-2. [Preparation of electron donating colorless dye capsule solution (B)]

The electron donating colorless dye capsule solution (B) was prepared in the same manner as the electron donating colorless dye capsule solution (A), except that the electron donating colorless dye was replaced by 8.9 g of 3,3-bis(1-octyl-2-methylindol-3-yl)phthalide.

2-1. [Preparation of photopolymerizable composition emulsion (A)]

To a solution of 0.063 g of the photopolymerization initiator (as set forth in Table 1) and 0.63 g of 2-mercaptophenothiazine (as an aid for accelerating polymerization) in 6 g of isopropyl acetate was added 5 g of 3-chloro-4-hydroxybenzoate-(6-methacryloyloxyhexyl)ester. The solution thus obtained was then added to a mixture solution of 13 g of a 15% aqueous solution of gelatin, 0.7 g of a 2% aqueous solution of sodium nonylphenoxybutanesulfonate, and 0.8 g of a 2% aqueous solution of bis-2-ethylhexylester sodium sulfosuccinate. The resulting mixture was then subjected to emulsification at 10,000 rpm by means of a homogenizer (produced by Nihon Seiki K.K.) for 5 minutes to prepare the photopolymerizable composition emulsion (A).

2-2. [Preparation of photopolymerizable composition emulsion (B)]

The photopolymerizable composition emulsion (B) was prepared in the same manner as the photopolymerizable composition emulsion (A), except that the photopolymerization initiator was not used.

3-1. [Preparation of light- and heat-sensitive layer coating solution (A)]

The light- and heat-sensitive layer coating solution (A) was prepared by mixing 1.4 g of the electron donating colorless dye capsule solution (A), 3.7 g of the photopolymerizable composition emulsion (A) and 1.1 g distilled water.

3-2. [Preparation of light- and heat-sensitive layer coating solution (B)]

The light- and heat-sensitive layer coating solution (B) was prepared by mixing 4.0 g of the electron donating colorless dye capsule solution (B), 12 g of the photopolymerizable composition emulsion (B) and 12 g of a 15% aqueous solution of gelatin.

4. [Preparation of interlayer coating solution]

An interlayer coating solution was prepared by mixing 20 g of distilled water, 12 g of a 15% aqueous solution of gelatin, and 1.0 g of a 2% aqueous solution of bis-2-ethylhexylester sodium sulfosuccinate.

5. [Preparation of protective coating solution]

A protective layer coating solution was prepared by mixing 4.5 g of a 10% aqueous solution of gelatin, 4.5 g of distilled water, 0.5 g of a 2% aqueous solution of potassium salt of N-octylsulfonyl-N-propylglycine, 0.3 g of a 2% aqueous solution of triethyleneglycol mono-p-nonylphenylether monosodium sulfobutyl ether, 0.5 g of a 2% aqueous solution of N,N'-bis(vinylsulfonylacetyl)ethylenediamine, and Syloid 72 (produced by Fuji Derision Chemical Ltd.) in amounts such that the coated amount thereof reached 50 mg/m².

6. [Preparation and evaluation of recording material]

The light- and heat-sensitive layer coating solution (A) was coated on a 100-μm thick polyethylene terephthalate film by means of a coating bar, in such an amount that the dried amount of the coat layer reached 8 g/m². The film was then dried at a temperature of 30° C. for 10 minutes. An interlayer coating solution was coated on this layer by means of a coating bar in such an amount that the dried amount of the coat layer reached 2 g/m². The material thus obtained was then dried at a temperature of 30° C. for 10 minutes. The light- and heat-sensitive layer coating solution (B) was next coated on this material in such an amount that the dried amount thereof reached 8 g/m². The material was then dried. Next, the protective layer coating solution was coated on the material by means of a coating bar in such an amount that the dried amount of the coat layer reached 2 g/m². The material was then dried at a temperature of 30° C. for 10 minutes to obtain a light- and heat-sensitive sheet.

The light- and heat-sensitive sheet thus obtained comprised a cyan coloring layer containing the photopolymerization initiator as the lowermost layer, an interlayer provided thereon, and a magenta coloring layer free of photopolymerization initiator provided on the interlayer. The light- and heat-sensitive sheet thus obtained was exposed to ultraviolet rays from a 2,000 W high voltage mercury vapor lamp (Type JP-2000 jet printer produced by ORC K.K.) through a step wedge [Fuji Step Guide-P (density difference: 0.15; number of density steps: 1 to 15) produced by Fuji Photo Film Co., Ltd.], and then heated over a 120° C. hot plate for 5 seconds. The cyan and magenta densities of the unexposed portion were 1.5 and 1.6, respectively.

Another batch of the light- and heat-sensitive sheet was exposed to light in such a manner that the color density of the cyan coloring layer reached its minimum value (clear step) at the 3rd step of the step wedge, and then heated for color development. The color density of this magenta coloring layer is set forth in Table 2. In order to examine the change in properties over time of the light- and heat-sensitive sheet, another batch of the light- and heat-sensitive sheet was exposed at a temperature of 45° C. and a relative-humidity of 75% for 1 day, 3 days and 7 days, respectively, and then heated for color development. The color density of this magenta coloring layer is set forth in Table 2.

COMPARATIVE EXAMPLES 1 TO 3

Light- and heat-sensitive sheets were prepared in the same manner as in Example 8 except that the photopolymerization initiators set forth in Table 1 to be used in the preparation of the photopolymerizable composition emulsion (A) were replaced by the comparative compounds set forth in Table 1, respectively. These light- and heat-sensitive sheets were evaluated in the same manner as in Example 8. The results are set forth in Table 2.

TABLE 2

| Example No. | Results of evaluation Magenta Color Density | | | |
|---|---|---|---|---|
| | Unprocessed | 1 Day | 3 Days | 7 Days |
| Example 8 | 1.60 | 1.60 | 1.60 | 1.59 |
| Example 9 | 1.60 | 1.60 | 1.59 | 1.58 |
| Example 10 | 1.60 | 1.60 | 1.58 | 1.56 |
| Comparative Example 1 | 1.61 | 1.51 | 1.31 | 0.98 |
| Comparative Example 2 | 1.60 | 1.45 | 1.20 | 0.81 |
| Comparative Example 3 | 1.60 | 1.20 | 0.80 | 0.45 |

Table 2 shows that she light- and heat-sensitive recording sheets comprising the light-sensitive bis-trihalomethyl-s-triazine compound of the present invention as the photopolymerization initiator, exhibit excellent storage stability.

EXAMPLE 11

On a 100-μm thick polyethylene terephthalate film as a tentative support was coated a coating solution of the composition set forth below. The resulting material was then dried to obtain a peelable layer having a dried thickness of 0.5 μm.

| Peelable layer coating solution | |
|---|---|
| Alcohol-soluble polyamide (CM-8000, viscosity: 23 cps, produced by Toray Industries Inc.) | 5.4 g |
| Polyhydroxy styrene (Resin M; average molecular weight: 5,000, produced by Maruzen Oil Company, Ltd.) | 3.6 g |
| Methanol | 400 g |
| Methyl cellosolve | 100 g |

TABLE 1

| Example No. | Photopolymerization initiators used in the preparation of recording materials Photopolymerization Initiator |
|---|---|
| Example 8 | Compound-2 |
| Example 9 | Compound-4 |
| Example 10 | Compound-1 |
| Comparative Example 1 | [triazine with two CCl$_3$ groups]—[phenyl]—[phenyl]—NHCO—[phenyl]—OCOCH$_3$ |
| Comparative Example 2 | [triazine with two CCl$_3$ groups]—[phenyl]—[phenyl]—OCH$_2$COOCH$_3$ |
| Comparative Example 3 | [triazine with two CCl$_3$ groups]—[phenyl]—[phenyl]—OCH$_3$ |

Yellow (Y), magenta (M), cyan (C) and black (K) sensitive coating solutions were prepared as photopolymerizable composition layer coating solutions having the following compositions:

| Photopolymerizable light-sensitive resin layer coating solution | |
|---|---|
| Yellow-sensitive coating solution: | |
| Benzyl methacrylate-methacrylic acid copolymer (molar ratio: 73/27; viscosity η: 0.12) | 60 g |
| Pentaerythritol tetraacrylate | 43.2 g |
| Compound-2 | 1.81 g |
| Seika Fast Yellow H-7055 (Dainichi Seika Kogyo K.K.) | 9.4 g |
| Methyl cellosolve acetate | 560 g |
| Methyl ethyl ketone | 280 g |
| Fluorine surface active agent (Florad FC-430, produced by Sumitomo 3M K.K.) | 1 g |
| Magenta-sensitive coating solution: | |
| Benzyl methacrylate-methacrylic acid copolymer (molar ratio: 73/27; viscosity η: 0.12) | 60 g |
| Pentaerythritol tetraacrylate | 43.2 g |
| Compound-2 | 1.81 g |
| Seika Fast Carmine 1483 (Dainichi Seika Kogyo K.K.) | 5.2 g |
| Methyl cellosolve acetate | 560 g |
| Methyl ethyl ketone | 280 g |
| Fluorine surface active agent (Florad FC-430, produced by Sumitomo 3M K.K.) | 1 g |
| Cyan-sensitive coating solution: | |
| Benzyl methacrylate-methacrylic acid copolymer (molar ratio: 73/27; viscosity η: 0.12) | 60 g |
| Pentaerythritol tetraacrylate | 43.2 g |
| Compound-2 | 1.81 g |
| Cyanine Blue 4920 (Dainichi Seika Kogyo K.K.) | 5.6 g |
| Methyl cellosolve acetate | 560 g |
| Methyl ethyl ketone | 280 g |
| Fluorine surface active agent (Florad FC-430, produced by Sumitomo 3M K.K.) | 1 g |
| Black-sensitive coating solution: | |
| Benzyl methacrylate-methacrylic acid copolymer (molar ratio: 73/27; viscosity η: 0.12) | 60 g |
| Pentaerythritol tetraacrylate | 43.2 g |
| Compound-2 | 1.81 g |
| Mitsubishi Carbon Black MA-100 (Dainichi Seika Kogyo K.K.) | 6.6 g |
| Methyl cellosolve acetate | 560 g |
| Methyl ethyl ketone | 280 g |
| Fluorine surface active agent (Florad FC-430, produced by Sumitomo 3M K.K.) | 1 g |

These light-sensitive coating solutions were respectively coated on the four tentative supports comprising a peelable layer. These coating materials were then dried to obtain colored photopolymerizable composition layers having a dried thickness of 2.4 μm.

A protective layer coating solution of the following composition was separately prepared. The coating solution thus prepared was coated on these color photopolymerizable composition layers, respectively, and then dried to form a protective layer having a dried thickness of 1.5 μm.

| Protective layer coating solution | |
|---|---|
| Polyvinyl alcohol (GL-05, produced by Nihon Gosei Kagaku Kogyo K.K.) | 60 g |
| Water | 970 g |
| Methanol | 30 g |

Thus, four kinds of color-sensitive transfer sheets (negative colored light-sensitive sheets) comprising a tentative support having provided thereon a peelable layer, a colored photopolymerizable composition layer, and a protective layer coated in this order were prepared.

EXAMPLE 12

Four kinds of color-sensitive transfer sheets were prepared in the same manner as in Example 11 except that the photopolymerization initiator was replaced by Compound-1.

EXAMPLE 13

Four kinds of color-sensitive transfer sheets were prepared in the same manner as in Example 11 except that the photopolymerization initiator was replaced by Compound-7.

COMPARATIVE EXAMPLE 4

Four kinds of color-sensitive transfer sheets were prepared in the same manner as in Example 11, except that the photopolymerization initiator was replaced by the compound set forth in Table 3.

COMPARATIVE EXAMPLE 5

Four kinds of color-sensitive transfer sheets were prepared in the same manner as in Example 11, except that the photopolymerization initiator was replaced by the compound set forth in Table 3.

TABLE 3

| | Photopolymerization initiators used in the preparation of recording materials |
|---|---|
| Example No. | Photopolymerization Initiators |
| Comparative Example 4 | (triazine with two $CCl_3$ groups linked to a phenyl-NHCO-phenyl-OH moiety) |

TABLE 3-continued

Photopolymerization initiators used in the preparation of recording materials

| Example No. | Photopolymerization Initiators |
|---|---|
| Comparative Example 5 | CCl₃ structure: bis(trichloromethyl)-triazine linked to phenyl—NHCO—phenyl—OCOCH₃ |

The structure for Comparative Example 5:

$$\text{CCl}_3\text{-triazine(N,N,N)-CCl}_3 \text{—} \langle\text{phenyl}\rangle \text{—} \langle\text{phenyl}\rangle \text{—NHCO—} \langle\text{phenyl}\rangle \text{—OCOCH}_3$$

[Evaluation of light-sensitive transfer sheet]

These color-sensitive transfer sheets were then subjected to the following coloring test:

Coloring test

These color-sensitive transfer sheets were each laminated with a corresponding color separating mask by means of a register pin, imagewise exposed to light from a 1 KW ultrahigh voltage mercury vapor lamp P-607 FW (produced by Dainippon Screen Mfg. Co., Ltd.) for 60 seconds, and then developed with a solution obtained by diluting a color art developer CA-1 (trade name of a developer produced by Fuji Photo Film Co., Ltd.) five times at a temperature of 31° C. for 22 seconds by means of an automatic developing machine (Color Art Processor CA-600 P, produced by Fuji Photo Film Co., Ltd.). Thus, four kinds of color-sensitive transfer sheets having a faithful reproduction of color separating masks were obtained.

A coating solution having the following formulations was coated on a 100 μm thick biaxially-oriented polyethylene terephthalate film to form a dried thickness of 20 μm. Thus, an image-receiving sheet was prepared.

| Image-receiving layer coating solution | |
|---|---|
| Methyl methacrylate polymer (average molecular weight: 100,000, produced by Wako Junyaku K.K.) | 90 g |
| Pentaerythritol tetraacrylate | 90 g |
| 2,2-Dimethoxy-2-phenylacetophenone | 3.18 g |
| p-Methoxyphenol | 0.09 g |
| Methyl ethyl ketone | 220 g |

A black-sensitive transfer sheet was superimposed on the image-receiving material in such a manner that the image side of the former came into contact with the film surface of the latter. The combination was then subjected to lamination by means of a color art transferring machine CA-600 T (produced by Fuji Photo Film Co., Ltd.). The tentative support of the light-sensitive transfer sheet was peeled off to transfer a black image to the image-receiving sheet.

Similarly, the other three kinds of color-sensitive transfer sheets were laminated with the image-receiving sheet, thereby transferring color images thereto. Thus, an image-receiving sheet having a four-color halftone image transferred thereon was obtained.

The image-receiving sheet thus obtained was then superimposed on art paper (final support). The combination was then subjected to lamination by means of the above-mentioned transferring machine. The material was exposed to light on the image-receiving sheet side for 120 seconds by means of a Type P-607 FW daylight printer (printer using a 1 KW ultrahigh voltage mercury vapor lamp, produced by Dainippon Screen Mfg. Co., Ltd.). The support of the image-receiving sheet was removed to obtain a final image (color proof) on the art paper.

The thus obtained image-receiving sheet having a four-color halftone image transferred thereon, was then measured for coloring on the nonimage portion by means of a reflective densitometer RD918 (using a B filter, produced by Macbeth K.K.). The results are set forth in Table 4.

TABLE 4

Results of evaluation

| Example No. | Photopolymerization Initiator | Coloring Degree (Reflective Density)[*1] |
|---|---|---|
| Example 11 | Compound-2 | 0.020 |
| Example 12 | Compound-1 | 0.010 |
| Example 13 | Compound-7 | 0.010 |
| Comparative Example 4 | Compound of table 3 | 0.110 |
| Comparative Example 5 | Compound of table 3 | 0.050 |

Note: "[*1]" Coloring degree = measured value of sample − measured value of (image-receiving layer + art paper)

Art paper and image-receiving layer

The image-receiving sheet was superimposed on an art paper (final support). The combination was then subjected to lamination by means of a color art transferring machine CA-600 T (produced by Fuji Photo Film Co., Ltd.). The material was then exposed to light for 120 seconds on the image-receiving sheet side by means of a Type P-607 daylight printer (using a 1 KW ultrahigh voltage mercury vapor lamp, produced by Dainippon Screen Mfg. Co., Ltd.). The support of the image-receiving sheet was then removed to obtain an image-receiving layer transferred on the art paper. The coloring of the sample thus obtained (image-receiving layer + art paper) was then measured by means of a reflective densitometer RD918 (using a B filter, produced by Macbeth K.K.).

The light-sensitive bistrihalomethyl-S-triazine compound of the present invention exhibits excellent storage stability. The use of this compound provides a photopolymerizable composition and a light- and heat-sensitive recording material with excellent storage stability.

Furthermore, when this compound is used as a photopolymerization initiator for the photopolymerizable composition layer in a light-sensitive transfer sheet, it allows for remarkably reduced coloring on the nonimage portion, provides excellent color proofing and provides improved proximity to printed matter.

While the invention has been described in detail and with reference to specific embodiments thereof, it will be apparent to one skilled in the art that various changes and modifications can be made therein without departing from the spirit and scope thereof.

What is claimed is:

1. A light-sensitive bistrihalomethyl-s-triazine compound represented by one of the following formulas (II) to (IV):

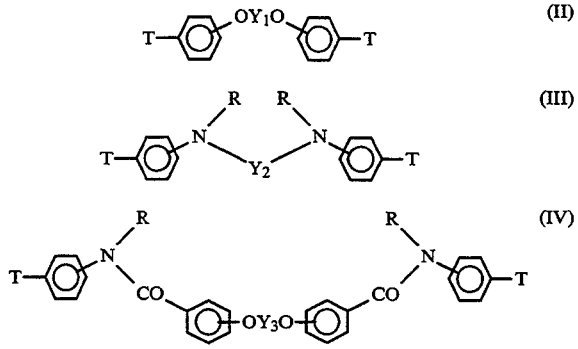

wherein T represents a (4,6-bistrihalomethyl-s-triazine-2-yl) group, $Y_1$ represents $-C_nH_{2n}-$ in which n represents an integer of 2 to 20, $-C_mH_{2m}COO(CH_2)_nOCOC_mH_{2m}-$ in which m represents an integer of 1 to 4, and n represents an integer 2 to 20, or $-CO(CH_2)_nCO-$ in which n represents an integer of 0 to 20, $Y_2$ represents $-C_nH_{2n}-$ in which n represents an integer of 2 to 20, $-CO(CH_2)_nCO-$ in which n represents an integer of 0 to 20, or $-CO(C_6H_4)CO-$, $Y_3$ represents $-C_nH_{2n}-$ in which n represents an integer 2 to 20, $-CO(CH_2)_nCO-$ in which n represents an integer of 0 to 20, or $-CO(C_6H_4)CO-$, and R represents a hydrogen atom, a $C_{1-10}$ alkyl group, or a $C_{2-10}$ acyl group, and the benzene rings of formulas (II) to (IV) may further contain a substituent selected from the group consisting of a $C_{1-6}$ alkyl group, a $C_{1-4}$ alkoxy group, a chlorine atom, a bromine atom and a fluorine atom.

2. The light-sensitive bistrihalomethyl-S-triazine compound of claim 1, wherein T represents a (4,6-bistrichloromethyl-S-triazine-2-yl) group or a (4,6-bistribromomethyl-s-triazine-2-yl) group.

3. The light-sensitive bistrihalomethyl-s-triazine compound of claim 1, wherein the compound is represented by formula (II).

4. The light-sensitive bistrihalomethyl-s-triazine compound of claim 1, wherein the compound is represented by formula (III).

5. The light-sensitive bistrihalomethyl-s-triazine compound of claim 1, wherein the compound is represented by formula (IV).

* * * * *